United States Patent
Paek et al.

(10) Patent No.: US 8,253,125 B2
(45) Date of Patent: Aug. 28, 2012

(54) SEMICONDUCTOR LIGHT EMITTING DEVICE AND METHOD OF MANUFACTURING THE SAME

(75) Inventors: Ho Sun Paek, Gyunggi-do (KR); Sung Nam Lee, Gyunggi-do (KR); Ten Sakong, Gyunggi-do (KR); Youn Joon Sung, Gyunggi-do (KR); In Hoe Hur, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 378 days.

(21) Appl. No.: 12/275,536

(22) Filed: Nov. 21, 2008

(65) Prior Publication Data

US 2009/0134410 A1    May 28, 2009

(30) Foreign Application Priority Data

Nov. 23, 2007  (KR) .................. 10-2007-0120431
Nov. 23, 2007  (KR) .................. 10-2007-0120432

(51) Int. Cl.
  *H01L 33/00* (2010.01)
(52) U.S. Cl. ....... 257/13; 257/14; 257/94; 257/E33.033; 257/E33.025; 257/22; 438/47
(58) Field of Classification Search ............ 257/13, 257/14, 22, 79, 84, 85, 94, E33.003, E33.025
See application file for complete search history.

(56) References Cited

U.S. PATENT DOCUMENTS

| | | | |
|---|---|---|---|
| 2006/0006400 A1* | 1/2006 | Yoo ................... | 257/94 |
| 2008/0308836 A1 | 12/2008 | Nakahara et al. | |
| 2009/0001409 A1 | 1/2009 | Takano et al. | |
| 2010/0012948 A1* | 1/2010 | Usikov et al. ........... | 257/76 |

FOREIGN PATENT DOCUMENTS

| | | |
|---|---|---|
| JP | 10-341060 | 12/1998 |
| JP | 2001-015443 | 1/2001 |
| JP | 2006-114886 | 4/2006 |
| JP | 2006-210578 | 8/2006 |
| JP | 2007-073630 | 3/2007 |
| KR | 10-2006-0009683 | 2/2006 |
| WO | WO 2006/030950 A1 | 3/2006 |

(Continued)

OTHER PUBLICATIONS

T.J. Baker et al, "Characterization of Planar Semipolar Gallium Nitride Films on Sapphire Substrates", Japanese Journal of Applied Physics, 2006, vol. 45, pp. L154-L157.*

(Continued)

*Primary Examiner* — Ha Tran T Nguyen
*Assistant Examiner* — Suberr Chi
(74) *Attorney, Agent, or Firm* — McDermott Will & Emery LLP

(57) ABSTRACT

There is provided a method of manufacturing a nitride semiconductor light emitting device. A method of manufacturing a nitride semiconductor light emitting device according to an aspect of the invention may include: nitriding a surface of an m-plane sapphire substrate; forming a high-temperature buffer layer on the m-plane sapphire substrate; depositing a semi-polar (11-22) plane nitride thin film on the high-temperature buffer layer; and forming a light emitting structure including a first nitride semiconductor layer, an active layer, and a second nitride semiconductor layer on the semi-polar (11-22) plane nitride thin film.

5 Claims, 6 Drawing Sheets

FOREIGN PATENT DOCUMENTS

WO    WO 2007/084783 A2    7/2007
WO    WO 2007/084783 A3    7/2007

OTHER PUBLICATIONS

Korean Office Action issued in Korean Patent Application No. 10-2007-0120431, dated May 25, 2009.

Japanese Office Action, w/ English translation thereof, issued in Japanese Patent Application No. JP 2008-296314 dated Aug. 23, 2011.

Japanese Office Action with English translation issued in Japanese application No. 2008-296314 issued on Apr. 3, 2012.

* cited by examiner

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application Nos. 2007-0120431 and 2007-0120432 filed on Nov. 23, 2007, the Korean Intellectual Property Office, the disclosure of which is incorporated herein by reference.

BACKGROUND OF THE INVENTION

1. Field of the Invention

The present invention relates to methods of manufacturing nitride semiconductor light emitting devices, and more particularly, to a method of manufacturing a nitride semiconductor light emitting device using an m-plane sapphire substrate.

2. Description of the Related Art

When a nitride semiconductor light emitting device is manufactured, nitride thin films, such as a gallium nitride thin film, are c-plane (0001) nitride thin films. The c-plane nitride thin films may be grown on a c-plane sapphire substrate by using metal organic chemical vapor deposition (MOCVD), molecular beam epitaxy (MBE), or hydride vapor phase epitaxy (HVPE).

The c-plane nitride thin film has polarity since a gallium layer and a nitrogen layer are repetitively stacked along the c-crystal axis, which induces an internal electric field. The internal electric field generated in the light emitting device causes a reduction in recombination of electrons and holes. Therefore, luminous efficiency of the light emitting device is reduced. Furthermore, piezoelectric polarization reduces a luminous wavelength. Therefore, it is difficult to achieve a long wavelength device.

To solve this problem, a semi-polar nitride thin film needs to be grown. However, when the c-plane sapphire substrate is used, it is difficult to grow a semi-polar plane nitride thin film. Therefore, a technique that grows a semi-polar nitride thin film by using a sapphire substrate of a non-polar plane is required. Furthermore, when a semi-polar nitride thin film is grown, high-quality crystallinity needs to be achieved to increase the reliability of the light emitting device.

SUMMARY OF THE INVENTION

An aspect of the present invention provides a nitride semiconductor light emitting device and a method of manufacturing the same that can increase luminous efficiency of the light emitting device by growing a semi-polar (11-22) plane nitride thin film by using an m-plane sapphire substrate.

An aspect of the present invention also provides a nitride semiconductor light emitting device and a method of manufacturing the same that can form a semi-polar (11-22) plane nitride thin film having high-quality crystallinity by nitriding an m-plane sapphire substrate in an optimum temperature range.

An aspect of the present invention also provides a nitride semiconductor light emitting device and a method of manufacturing the same that can form a semi-polar (11-22) plane nitride thin film having high-quality crystallinity by forming a high-temperature buffer layer having an optimum thickness on an m-plane sapphire substrate.

According to an aspect of the present invention, there is provided a method of manufacturing a nitride semiconductor light emitting device, the method including: nitriding a surface of an m-plane sapphire substrate; forming a high-temperature buffer layer on the m-plane sapphire substrate; depositing a semi-polar (11-22) plane nitride thin film on the high-temperature buffer layer; and forming a light emitting structure including a first nitride semiconductor layer, an active layer, and a second nitride semiconductor layer on the semi-polar (11-22) plane nitride thin film.

The nitriding the m-plane sapphire substrate may include: introducing the m-plane sapphire substrate into an MOCVD chamber; and supplying ammonia ($NH_3$) gas into the MOCVD chamber.

The nitriding the surface of the m-plane sapphire substrate may be performed within an optimum temperature range of 750 to 900° C.

The forming the high-temperature buffer layer may include: introducing the m-plane sapphire substrate into the MOCVD chamber and forming gas atmosphere including nitrogen ($N_2$); and increasing the temperature inside the MOCVD chamber to a temperature within a range of 900 to 1100° C. to perform epitaxial growth.

The high-temperature buffer layer may be formed to have a thickness within a range of 100 to 20000 Å.

The high-temperature buffer layer may be formed to have a thickness within a range of 1000 to 4000 Å.

The semi-polar (11-22) plane nitride thin film may have a thickness within a range of 1 to 3 um.

The semi-polar (11-22) plane nitride thin film may have a single crystal structure.

The method may further include: etching a part of the light emitting structure to expose the first nitride semiconductor layer; and forming a first electrode on an exposed portion of the first nitride semiconductor layer, and a second electrode on the second nitride semiconductor layer.

According to an aspect of the present invention, there is provided a nitride semiconductor light emitting device including: a nitrided m-plane sapphire substrate; a high-temperature buffer layer provided on the m-plane sapphire substrate; a semi-polar (11-22) plane nitride thin film provided on the high-temperature buffer layer; and a light emitting structure including a first nitride semiconductor layer, an active layer, and a second nitride semiconductor layer on the semi-polar (11-22) plane nitride thin film, the first nitride semiconductor having an exposed portion.

The m-plane sapphire substrate may be nitrided within an optimum temperature range of 750 to 900° C.

The high-temperature buffer layer may have a thickness within a range of 100 to 20000 Å.

The high-temperature buffer layer may have a thickness within a range of 1000 to 4000 Å.

The semi-polar (11-22) plane nitride thin film may have a thickness of 2 to 3 μm.

The semi-polar (11-22) plane nitride thin film may have a single crystal structure.

The nitride semiconductor light emitting device may further include: a first electrode provided on the exposed portion of the first nitride semiconductor layer; and a second electrode provided on the second nitride semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
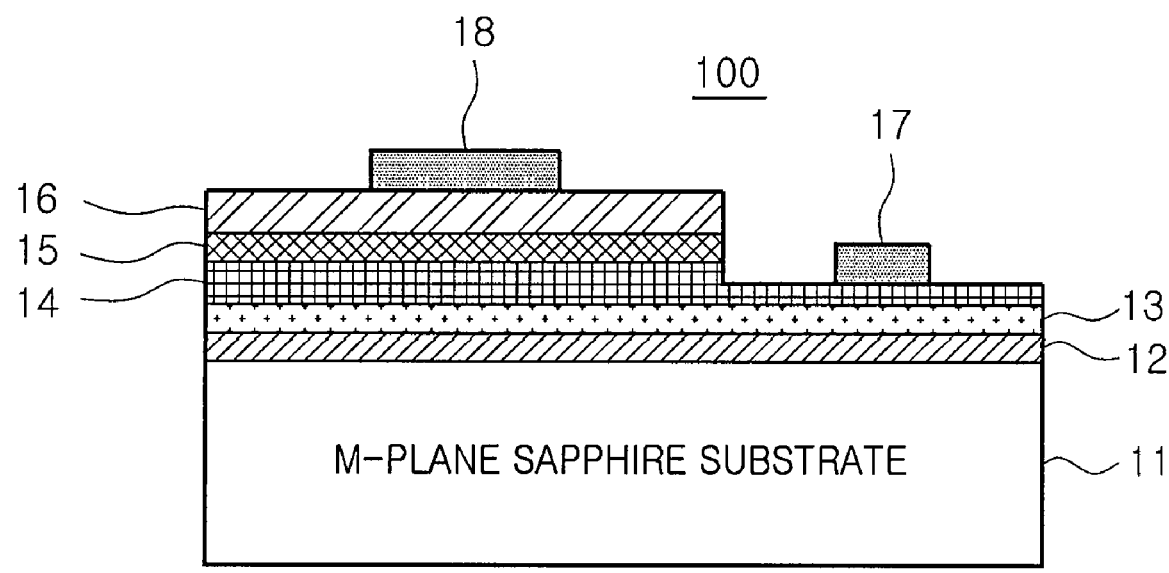
FIG. 1 is a vertical cross-sectional view illustrating a nitride semiconductor light emitting device according to an exemplary embodiment of the invention.

FIG. 1 is a vertical cross-sectional view illustrating a nitride semiconductor light emitting device according to an exemplary embodiment of the invention. Referring to FIG. 1, the nitride semiconductor light emitting device 100 according to this embodiment includes an m-plane sapphire substrate 11, a high-temperature buffer layer 12, a semi-polar (11-22) plane nitride thin film 13, a first nitride semiconductor layer 14, an active layer 15, a second nitride semiconductor layer 16, a first electrode 17, and a second electrode 18.

The m-plane sapphire substrate 11 has non-polar plane, where the semi-polar (11-22) plane nitride thin film 13 is grown. In this embodiment, the surface of the m-plane sapphire substrate 11 is nitrided. With the nitridation of the m-plane sapphire substrate 11, defects caused by a difference in lattice constant can be reduced. Further, the nitridation of the m-plane sapphire substrate 11 allows formation of a nucleus for growth of the high-temperature buffer layer 12. Here, the m-plane sapphire substrate 11 may be nitrided in an optimum temperature range in order to stably perform the nitridation. The optimum temperature range may be a temperature range of approximately 750 to 900° C.

The high-temperature buffer layer 12 is formed to prevent a generation of strain caused by a difference in lattice constant between the m-plane sapphire substrate 11 and the semi-polar (11-22) plane nitride thin film 13. Here, the high-temperature buffer layer 12 may be grown to have a thickness of approximately 100~20000 Å at a high temperature of approximately 900 to 1100° C. Preferably, the high-temperature buffer layer 12 may be formed within an appropriate thickness range of approximately 1000 to 4000 Å. Further, the high-temperature buffer layer 12 may be formed of a semiconductor material satisfying the equation of $Al_xGa_{(1-x)}N$ ($0 \leq x < 1$).

The semi-polar (11-22) plane nitride thin film 13 is formed of a gallium nitride (GaN) semiconductor, and has a high-quality single crystal. Here, the semi-polar (11-22) plane nitride thin film 13 may have a thickness of approximately 2 to 3 μm.

The first nitride semiconductor layer 14, the active layer 15, and the second nitride semiconductor layer 16 that form a light emitting structure are formed on the semi-polar (11-22) plane nitride thin film 13. Here, the first nitride semiconductor layer 14 may be an n-GaN semiconductor layer, and the second nitride semiconductor layer 16 may be a p-GaN semiconductor layer. Further, the active layer 15 may be a GaN-based semiconductor layer having a single or multiple quantum well structure. The first electrode 17 connected to the first nitride semiconductor layer 14 may be an n-electrode, and the second electrode 18 may be a p-electrode. Here, types of the first nitride semiconductor layer 14, the second nitride semiconductor layer 16, the first electrode 17, and the second electrode 18 can be easily changed. The invention is not limited thereto.

In the nitride semiconductor light emitting device, shown in FIG. 1, the semi-polar (11-22) plane nitride thin film 13 is formed using the m-plane sapphire substrate 11 to thereby increase luminous efficiency.

FIGS. 2A through 2E are vertical cross-sectional views illustrating a method of manufacturing a nitride semiconductor light emitting device according to an exemplary embodiment of the invention.

Figure 2A:
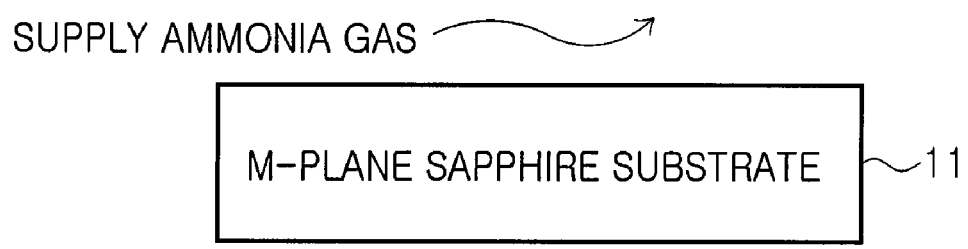
FIGS. 2A through 2E are vertical cross-sectional views illustrating a method of illustrating a nitride semiconductor light emitting device according to the exemplary embodiment of the invention.

Referring to FIG. 2A, the m-plane sapphire substrate 11 is introduced into an MOCVD chamber, and ammonia ($NH_3$) gas is flown into the MOCVD chamber so as to nitride the m-plane sapphire substrate 11. The ammonia gas may be supplied at a flow rate of 1 sccm ($cm^3$/min) or more. Here, the nitridation of the m-plane sapphire substrate 11 is performed within an appropriate temperature range. Here, the appropriate temperature range defined in this embodiment of the invention may be a temperature range of approximately 750 to 900° C. When the m-plane sapphire substrate 11 is nitrided in the appropriate temperature range, the surface thereof is modified to increase a growth characteristic of the high-temperature buffer layer 12. The increase in growth characteristic of the high-temperature buffer layer 12 may increase the crystallinity of the semi-polar (11-22) plane nitride thin film 13. That is, according to a result of the nitridation of the m-plane sapphire substrate 11, the crystallinity of the semi-polar (11-22) plane nitride thin film 13 may be determined.

Figure 2B:
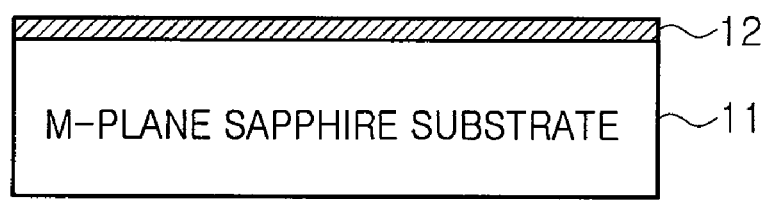

Referring to FIG. 2B, the high-temperature buffer layer 12 is grown on the nitrided m-plane sapphire substrate 11. Specifically, while the m-plane sapphire substrate 11 is introduced into the MOCVD chamber, epitaxial growth of a semiconductor material satisfying the equation of $Al_xGa_{(1-x)}N$ ($0 \leq x < 1$) is performed to form the high-temperature buffer layer 12. Here, the epitaxial growth is performed in gas atmosphere including nitrogen at a temperature within a range of 900 to 1100° C.

The crystallinity of the semi-polar (11-22) plane nitride thin film may be varied according to the growth characteristic (for example, surface characteristic) of the high-temperature buffer layer 12. Specifically, the high-temperature buffer layer 12 is a thin film that prevents the generation of strain caused by a difference in lattice constant between the m-plane sapphire substrate 11 and the semi-polar (11-22) plane nitride thin film. Therefore, the crystallinity of the semi-polar (11-22) plane nitride thin film may be determined according to the growth characteristics of the high-temperature buffer layer 12. In order to obtain stable growth characteristics of the high-temperature buffer layer 12, the high-temperature buffer layer 12 needs to be grown with an optimum thickness range of 100 to 20000 Å. In this embodiment, the high-temperature buffer layer 12 may have an optimum thickness range of approximately 1000 to 4000 Å. Preferably, the high-temperature buffer layer 12 may be formed with a thickness of 2000 Å.

The thickness of the high-temperature buffer layer 12 may be easily controlled by adjusting the growth time. For example, the growth time may be determined to be approximately five minutes in order that the high-temperature buffer layer 12 has a thickness of 1000 Å. Alternatively, the growth time may be determined to be about ten minutes in order that the high-temperature buffer layer 12 has a thickness of 2000 Å. As such, the thickness of the high-temperature buffer layer 12 can be easily controlled by adjusting the growth time. The growth thickness in proportion to the growth time of the high-temperature buffer layer 12 varies according to growth performance of the MOCVD chamber, the growth environment, and the like. However, the invention is not limited to the above description.

Figure 2C:

Then, as shown in FIG. 2C, the semi-polar (11-22) plane nitride thin film 13 having a thickness of approximately 2 μm is grown on the high-temperature buffer layer 12. The semi-polar (11-22) plane nitride thin film 13 is grown in parallel with the surface of the m-plane sapphire substrate 11. With the increase in growth characteristic of the high-temperature buffer layer 12, the semi-polar (11-22) plane nitride thin film 13 is correspondingly grown to have a high-quality single crystal.

Figure 2D:
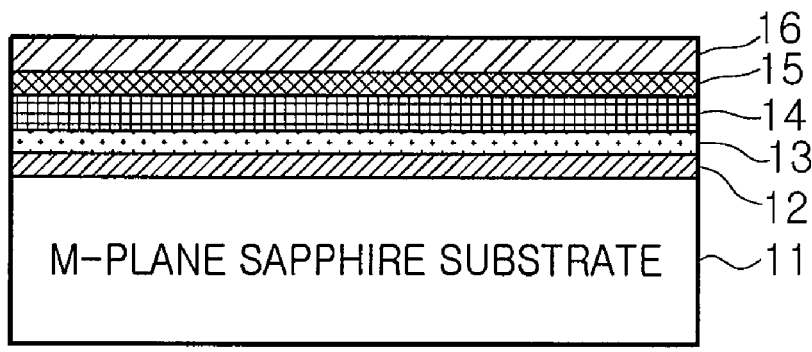

Then, as shown in FIG. 2D, the light emitting structure that includes the first nitride semiconductor layer 14, the active layer 15, and the second nitride semiconductor layer 16 is formed on the semi-polar (11-22) plane nitride thin film 13. Specifically, the first nitride semiconductor layer 14 may be formed by doping a GaN semiconductor material with an n-type dopant, such as Si, In, and Sn. The active layer 15 may have a single quantum well structure or a multi quantum well structure by using a GaN-based material, such as GaN or InGaN. Further, the second nitride semiconductor layer 16 may be formed by doping a GaN semiconductor material with a p-type dopant, such as Zn, Cd, or Mg. Here, each of the first nitride semiconductor layer 14, the active layer 15, and the second nitride semiconductor layer 16 may be formed by using a deposition method, such as Metal Organic Chemical Vapor Deposition (MOCVD) or Molecular Beam Epitaxy (MBE).

Figure 2E:
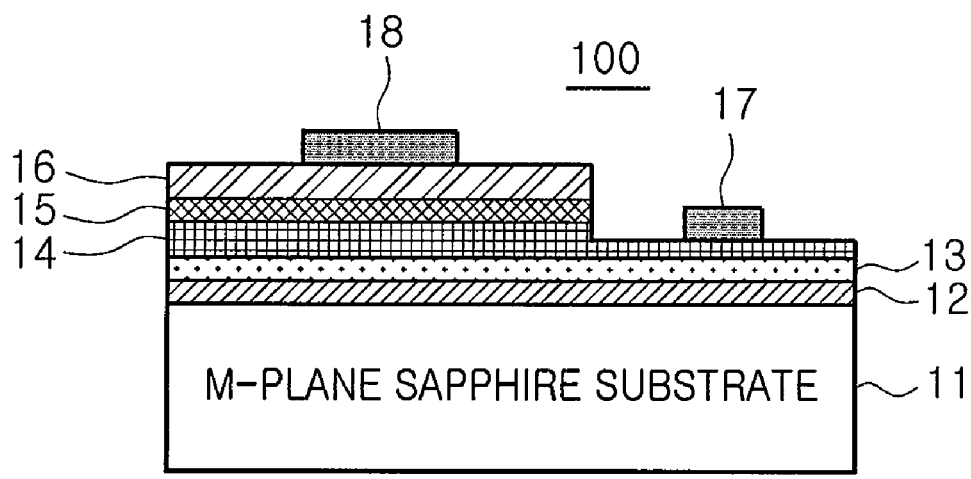

As shown in FIG. 2E, a partial surface of the light emitting structure is etched to expose the first nitride semiconductor layer 14. Then, the first electrode 17 is formed on the exposed first nitride semiconductor layer 14, and the second electrode 18 is formed on an upper part of the light emitting structure, that is, on the second nitride semiconductor layer 16. Here, the first electrode 17 may be an n-electrode, and the second electrode 18 may be a p-electrode.

As the nitride semiconductor light emitting device is manufactured by using the method as shown in FIGS. 2A to 2E, the m-plane sapphire substrate 11 may be nitrided in the appropriate temperature range to improve the crystallinity of the high-temperature buffer layer 12 and the semi-polar (11-22) plane nitride thin film 13, thereby increasing the reliability of the light emitting device.

Further, as the semi-polar (11-22) plane nitride thin film 13 is formed on the high-temperature buffer layer 12 having the appropriate thickness range of 1000 to 4000 Å, the semi-polar (11-22) plane nitride thin film 13 can have a high-quality single crystal structure. Accordingly, the light emitting device using the semi-polar (11-22) plane nitride thin film 13 can prevent the generation of an internal electric field, and reduce piezoelectric polarization to thereby increase luminous efficiency.

Figure 3A:
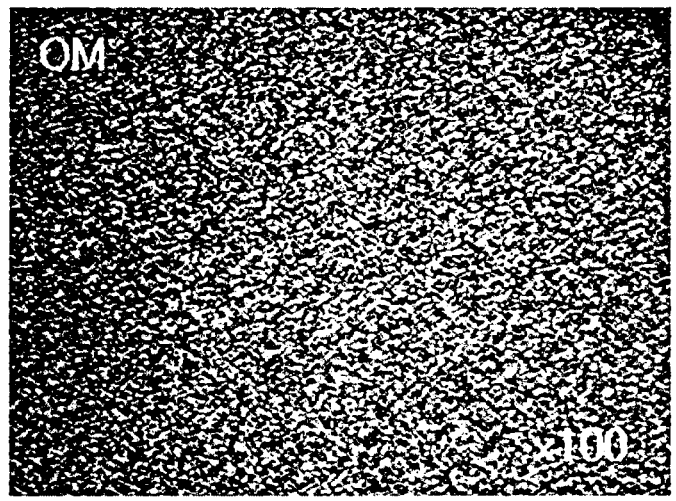
FIGS. 3A through 3C are OM pictures obtained by capturing the surfaces of semi-polar (11-22) plane nitride thin films according to comparative examples 1 and 2, and an inventive example.
Figure 3B:
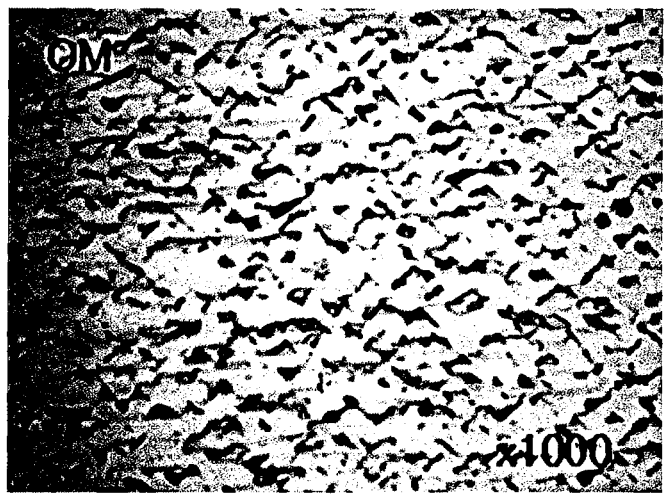
Figure 3C:
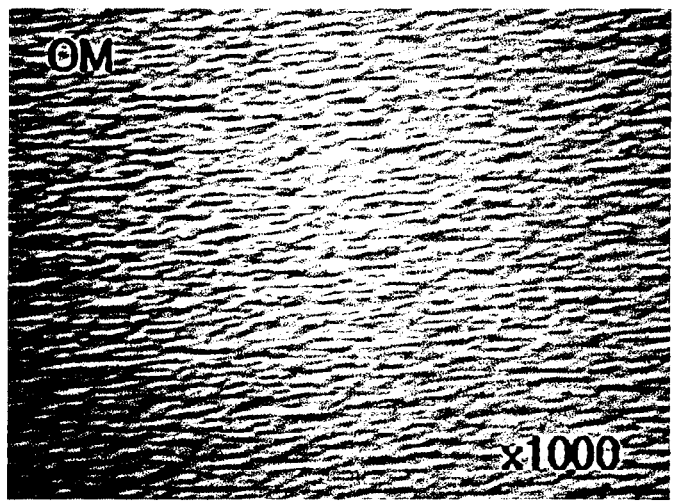

FIGS. 3A to 3C are OM pictures showing the surfaces of semi-polar (11-22) plane nitride thin films according to comparative examples 1 and 2 and an inventive example.

FIG. 3A is an OM picture obtained by capturing the surface of a semi-polar (11-22) plane nitride thin film formed by using a method of growing a nitride thin film on an m-plane sapphire substrate according to the related art, which corresponds to the comparative example 1.

Specifically, after the m-plane sapphire substrate is introduced in an MOCVD chamber, the m-plane sapphire substrate is nitrided at a temperature of 450 to 1100° C. Then, epitaxial growth is performed in gas atmosphere containing nitrogen at a temperature of 250 to 450° C. to form a low-temperature buffer layer. Then, a semi-polar (11-22) plane nitride thin film is formed. In a case of the comparative example 1 using the method of growing a nitride thin film according to the related art, the buffer layer is formed on the m-plane sapphire substrate at low temperature to reduce a growth characteristic of the low-temperature buffer layer. Therefore, the semi-polar (11-22) plane nitride thin film formed on the low-temperature buffer layer has an unstable surface structure as shown in FIG. 3A. Thus, it is difficult to deposit a light emitting structure thereon.

FIG. 3B is an OM picture obtained by capturing a surface of a semi-polar (11-22) plane nitride thin film grown on an m-plane sapphire substrate nitrided at a temperature of 450 to 700° C., which corresponds to the comparative example 2.

Specifically, the m-plane sapphire substrate is introduced into the MOCVD chamber, and ammonia gas is flown at a temperature of 450 to 700° C., thereby nitriding the substrate. Then, the temperature inside the MOCVD chamber is increased over a range of 900 to 1100° C. to form a high-temperature buffer layer. A semi-polar (11-22) plane nitride thin film is formed on the high-temperature buffer layer. When the m-plane sapphire substrate is nitrided at the temperature of 450 to 700° C., the nitridation is not properly performed, and thus it becomes difficult to perform surface modification. The deterioration in growth characteristic of the high-temperature buffer layer causes deterioration of the crystallinity of the semi-polar (11-22) plane nitride thin film. That is, as shown in FIG. 3B, the surface of the semi-polar (11-22) plane nitride thin film in the comparative example 2 has an amorphous-crystalline structure. The semi-polar (11-22) plane nitride thin film having this crystalline structure reduces deposition characteristics when the first nitride semiconductor layer, the active layer, and the second nitride semiconductor layer are deposited. As a result, the reliability of the light emitting device is reduced.

Though not shown as a comparative example, even when the m-plane sapphire substrate is nitrided at a temperature of 950 to 1100° C., the semi-polar (11-22) plane nitride thin film has an amorphous-crystalline structure as shown in FIG. 3B. Therefore, when the m-plane sapphire substrate is nitrided at low or high temperature, the crystallinity of the semi-polar (11-22) nitride thin film is reduced.

FIG. 3C is a view showing an OM picture obtained by capturing a semi-polar (11-22) plane nitride thin film that is grown on an m-plane sapphire substrate nitrided at a temperature of 750 to 900° C. Specifically, after the m-plane sapphire substrate is nitrided at the temperature of 750 to 900° C., a high-temperature buffer layer is grown at a temperature of 900 to 1100° C. Here, the surface of the m-plane sapphire substrate is modified through the nitridation, and lattice matching between the high-temperature buffer layer and the m-plane sapphire substrate is improved. As a result, the high-temperature buffer layer has a smooth surface morphology, and the semi-polar (11-22) plane nitride thin film is grown to have a single crystal structure. That is, the semi-polar (11-22) plane nitride thin film is grown to be a high-quality semiconductor layer having a mirror surface. Therefore, a light emitting structure can be easily deposited thereon, thereby increasing luminous efficiency of the light emitting device.

The comparative examples 1 and 2, and the inventive example will now be compared with each other. If a high-temperature buffer layer is grown by nitriding the m-plane sapphire substrate at the temperature within the range of 750 to 900° C., it can be observed that the crystallinity of the semi-polar (11-22) plane nitride thin film is improved.

Figure 4A:
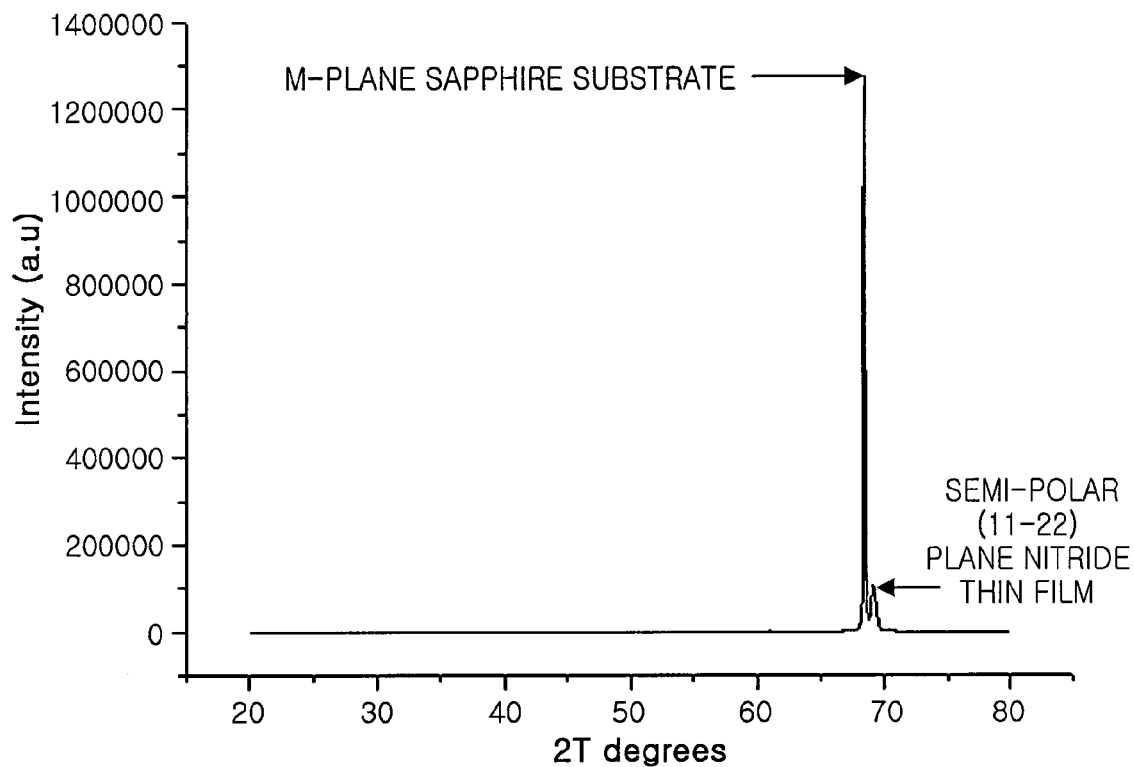
FIGS. 4A and 4B are graphs illustrating the crystallinity of a semi-polar (11-22) plane nitride thin film according to an exemplary embodiment of the invention.
Figure 4B:
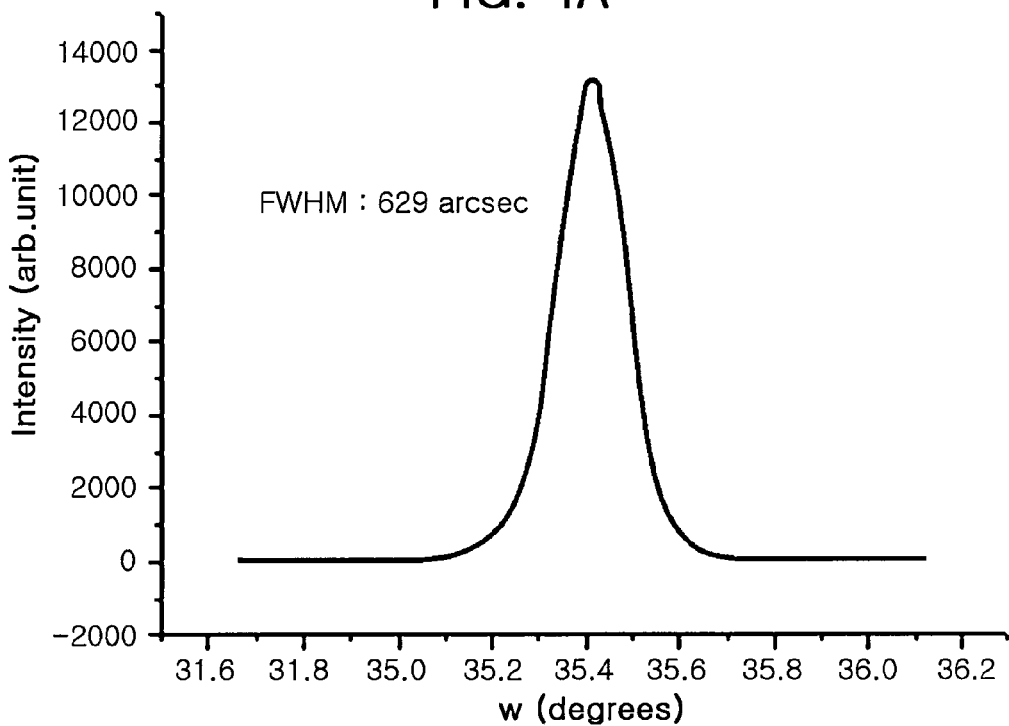

FIGS. 4A and 4B are graphs illustrating the crystallinity of the semi-polar (11-22) plane nitride thin film according to the embodiment of the invention. First, in the graph of FIG. 4A, it is shown whether or not the semi-polar (11-22) plane nitride thin film has a single crystal structure. X-rays are incident upon the semi-polar (11-22) plane nitride thin film, and characteristics of diffracted x-rays are shown in the graph of FIG. 4A. Each of the m-plane sapphire substrate and the nitride thin film is found to have a peak, that is, has a single crystal structure.

FIG. 4B is a graph illustrating x-ray diffraction patterns of the surface of the semi-polar (11-22) plane nitride thin film. The surface of the semi-polar nitride thin film has a full width at half maximum (FWMH) of 629 arcsec.

Figure 5A:
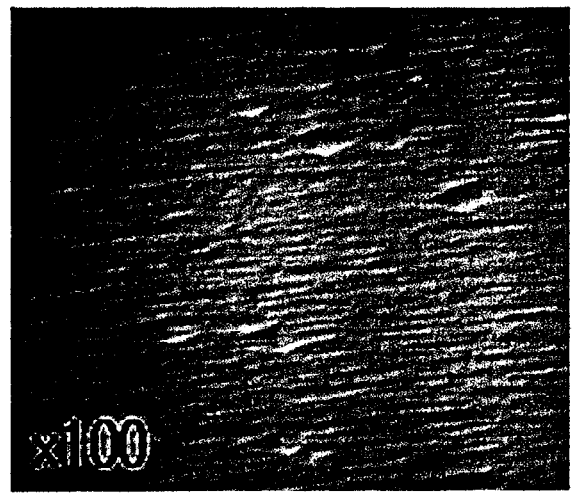
FIGS. 5A through 5C are OM pictures obtained by capturing the surfaces of semi-polar (11-22) plane nitride thin films according to deposition thicknesses of high-temperature buffer layers.
Figure 5B:
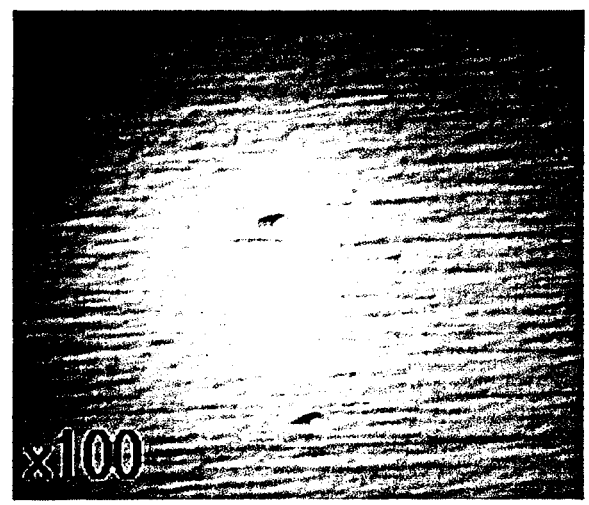
Figure 5C:
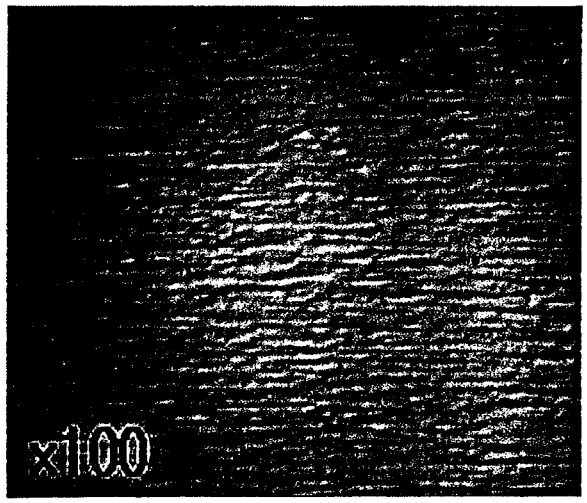

FIGS. 5A through 5C are OM pictures obtained by capturing the surfaces of semi-polar (11-22) plane nitride thin films according to growth thicknesses of high-temperature buffer layers. All of the semi-polar (11-22) plane nitride thin films, shown in FIGS. 5A through 5C, are grown on the m-plane sapphire substrates that are nitrided at the temperature of 750 to 900° C. The semi-polar (11-22) plane nitride thin films are grown on the high-temperature buffer layers having different thicknesses.

FIG. 5A is an OM picture obtained by capturing the surface of a semi-polar (11-22) plane nitride thin film 13a formed on a high-temperature buffer layer having a thickness of 500 Å. As shown in FIG. 5A, it can be observed that a plurality of hillocks are formed on the surface of the semi-polar (11-22) plane nitride thin film 13a. Since the high-temperature buffer layer that is thin with the thickness of 500 Å does not have stable growth characteristics of the high-temperature buffer layer, the crystallinity of the semi-polar (11-22) plane nitride thin film 13a is reduced.

FIG. 5B is an OM picture obtained by capturing the surface of a semi-polar (11-22) plane nitride thin film 13b that is formed on a high-temperature buffer layer having a thickness of 2000 Å. Referring to FIG. 5B, the number of hillocks on the semi-polar (11-22) plane nitride thin film 13b is much lower than that of the semi-polar (11-22) plane nitride thin film 13a, shown in FIG. 5A. A semi-polar (11-22) plane nitride thin film 13b is grown on a high-temperature buffer layer having a stable growth characteristic, such that the semi-polar (11-22) plane nitride thin film 13b can have a high-quality single crystal structure.

FIG. 5C is an OM picture obtained by capturing the surface of a semi-polar (11-22) plane nitride thin film 13c that is formed on a high-temperature buffer layer having a thickness of 50000 Å. Referring to FIG. 5C, it can be observed that pits are formed on the surface of the semi-polar (11-22) plane nitride thin film 13c. The pits formed in the polar (11-22) plane nitride thin film 13c are one of the causes of reduction in reliability of the light emitting device, which causes difficulty in manufacturing light emitting devices.

When the high-temperature buffer layer has a thickness outside the optimum thickness range of 1000 to 4000 Å, the crystallinity of the semi-polar (11-22) plane nitride thin film formed on the high-temperature buffer layer is reduced. Therefore, as shown in FIG. 5B, the high-temperature buffer layer is preferably formed to have a thickness of 2000 Å so as to reduce the number of hillocks generated on the semi-polar (11-22) plane nitride thin film, and prevent a generation of pits.

Figure 6:
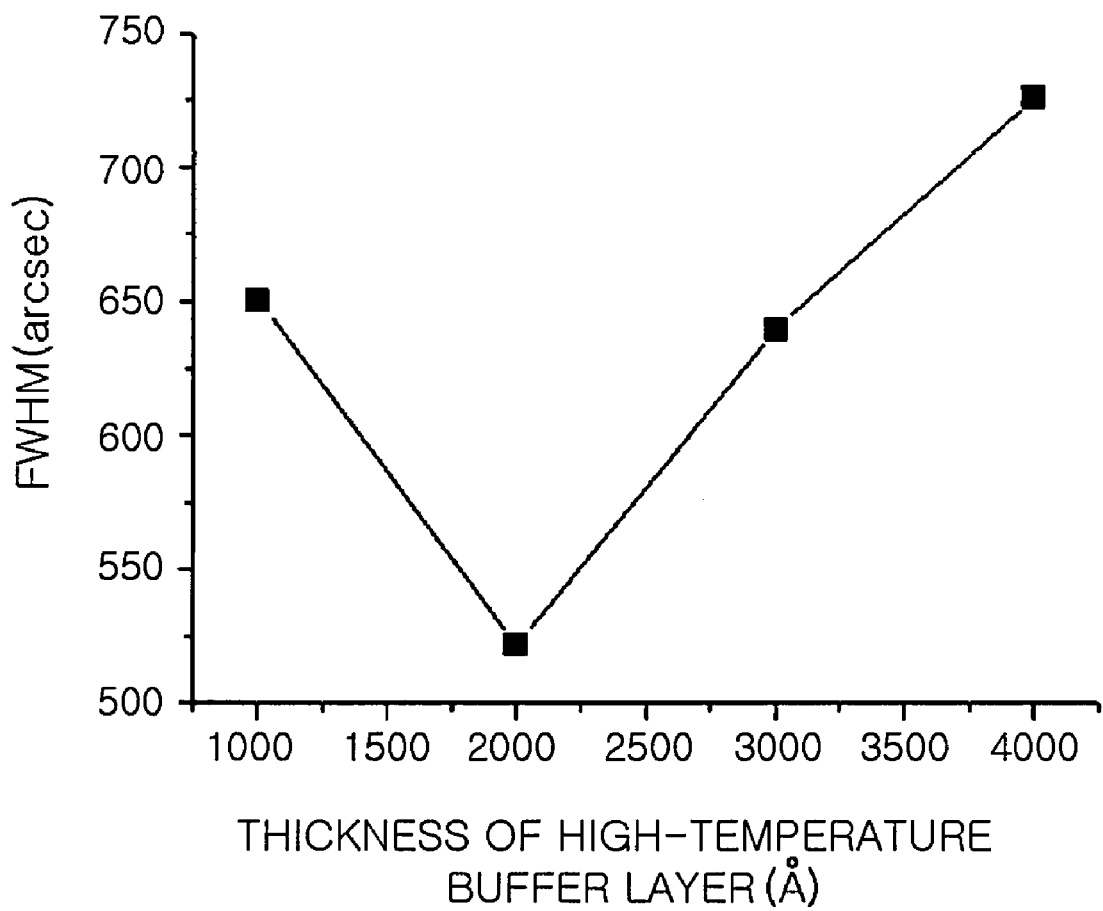
FIG. 6 is a graph illustrating the crystallinity of a semi-polar (11-22) plane nitride thin film according to a deposition thickness of a high-temperature buffer layer.

FIG. 6 is a graph showing the crystallinity of the semi-polar (11-22) plane nitride thin film according to the deposition thickness of the high-temperature buffer layer. In the graph, the x-direction indicates a thickness (Å) of a high-temperature buffer layer, and the y-direction indicates an FWHM (Full width at half maximum). The FWHM shows the crystallinity of the semi-polar nitride thin film. The lower the FWHM is, the higher the crystallinity is.

Referring to the graph of FIG. 6, when the high-temperature buffer layer has a thickness of 1000 Å or 3000 Å, the FWHM of the semi-polar (11-22) plane nitride thin film is approximately 650 arcsec. Further, when the high-temperature buffer layer has a thickness of 4000 Å, the FWHM of the semi-polar (11-22) plane nitride thin film is approximately 725 arcsec. When the high-temperature buffer layer has a thickness of 2000 Å, the FWHM of the semi-polar (11-22) plane nitride thin film is approximately 525 arcsec.

When the semi-polar (11-22) plane nitride thin film, which is formed on the high-temperature buffer layer having the thickness within the range of approximately 1000 to 4000 Å, shows an FWHM of 525 to 725 arcsec. Here, it can be known that the semi-polar (11-22) plane nitride thin film has a high-quality single crystal structure. Furthermore, it can be seen that the semi-polar (11-22) plane nitride thin film has the most improved crystallinity when the high-temperature buffer layer has a thickness of 2000 Å. Therefore, a high-temperature buffer layer is preferably formed to have a thickness of the 2000 Å, in order to form a semi-polar (11-22) plane nitride thin film.

As set forth above, according to exemplary embodiments of the invention, a semi-polar (11-22) plane nitride single crystal layer is formed on an m-plane sapphire substrate, thereby preventing the generation of an internal electric field, and increasing the recombination between electrons and holes required for light emission. Accordingly, luminous efficiency of the light emitting device can be increased, and long-wavelength light can be easily generated.

Further, the m-plane sapphire substrate is nitrided at A temperature of 750 to 900° C., a semi-polar (11-22) plane nitride thin film having a high-quality single crystal structure can be formed to thereby increase product reliability of a light emitting device.

Further, a high-temperature buffer layer, which is formed on an m-plane sapphire substrate, is formed to have a thickness within a range of approximately 1000 to 4000 Å, preferably, a thickness of 2000 Å, to thereby form a semi-polar (11-22) plane nitride thin having a high-quality single crystal structure. Therefore, a light emitting structure can be easily formed on the semi-polar (11-22) plane nitride thin film, thereby increasing product reliability of a light emitting device.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
   a nitrided m-plane sapphire substrate;
   a high-temperature buffer layer provided directly on the nitrided m-plane sapphire substrate;
   a semi-polar (11-22) plane nitride thin film provided directly on the high-temperature buffer layer; and a light emitting structure including a first nitride semiconductor layer, an active layer, and a second nitride semiconductor layer on the semi-polar (11-22) plane nitride thin film, the first nitride semiconductor having an exposed portion, wherein the high-temperature buffer layer has a thickness within a range of 1000 to 4000 Å.

2. The nitride semiconductor light emitting device of claim 1, wherein the nitrided m-plane sapphire substrate is nitrided within an optimum temperature range of 750 to 900° C.

3. The nitride semiconductor light emitting device of claim 1, wherein the semi-polar (11-22) plane nitride thin film has a thickness of 2 to 3 μm.

4. The nitride semiconductor light emitting device of claim 1, wherein the semi-polar (11-22) plane nitride thin film has a single crystal structure.

5. The nitride semiconductor light emitting device of claim 1, further comprising:
   a first electrode provided on the exposed portion of the first nitride semiconductor layer; and
   a second electrode provided on the second nitride semiconductor layer.

* * * * *